United States Patent
Aoki

(10) Patent No.: US 8,842,205 B2
(45) Date of Patent: Sep. 23, 2014

(54) SOLID-STATE IMAGING DEVICE AND CAMERA SYSTEM

(71) Applicant: Olympus Corporation, Tokyo (JP)

(72) Inventor: Jun Aoki, Tokyo (JP)

(73) Assignee: Olympus Corporation, Tokyo (JP)

( * ) Notice: Subject to any disclaimer, the term of this patent is extended or adjusted under 35 U.S.C. 154(b) by 21 days.

(21) Appl. No.: 13/788,898

(22) Filed: Mar. 7, 2013

(65) Prior Publication Data
US 2013/0235237 A1  Sep. 12, 2013

(30) Foreign Application Priority Data
Mar. 9, 2012  (JP) ................................. 2012-053279

(51) Int. Cl.
*H04N 5/335* (2011.01)
*H01L 27/146* (2006.01)

(52) U.S. Cl.
CPC .............................. *H01L 27/14625* (2013.01)
USPC ....................................................... 348/294

(58) Field of Classification Search
CPC ....... H04N 5/335; H04N 5/378; H04N 3/155; H01L 27/14625; H01L 27/14627; H01L 27/14643
See application file for complete search history.

(56) References Cited

U.S. PATENT DOCUMENTS

| 8,305,483 | B2* | 11/2012 | Fujii et al. | 348/345 |
|---|---|---|---|---|
| 8,395,686 | B2* | 3/2013 | Tatani et al. | 348/302 |
| 8,493,452 | B2* | 7/2013 | Kikuchi | 348/208.11 |
| 2009/0295953 | A1* | 12/2009 | Nozaki | 348/294 |
| 2010/0237451 | A1* | 9/2010 | Murakoshi | 257/432 |

FOREIGN PATENT DOCUMENTS

JP  2010-160314 A  7/2010

* cited by examiner

*Primary Examiner* — Luong T Nguyen
(74) *Attorney, Agent, or Firm* — Westerman, Hattori, Daniels & Adrian, LLP

(57) ABSTRACT

A first substrate has a plurality of photoelectric conversion units. A second substrate has through vias connected to the first substrate, and a plurality of photoelectric conversion units. A third substrate has vias connected to the second substrate, and a circuit that processes a signal. Wiring lines of the first substrate select the angle of a light ray that is transmitted through the first substrate and enters the second substrate.

12 Claims, 8 Drawing Sheets

SOLID-STATE IMAGING DEVICE AND CAMERA SYSTEM

BACKGROUND OF THE INVENTION

1. Field of the Invention

The present invention relates to a solid-state imaging device having a plurality of substrates and a camera system equipped therewith.

Priority is claimed on Japanese Patent Application No. 2012-053279, filed Mar. 9, 2012, the contents of which are incorporated herein by reference.

2. Description of Related Art

In recent years, generally, video cameras, electronic still cameras, or the like have become widely prevalent. CCD (Charge Coupled Device) type or amplified solid-state imaging devices are used for these cameras. The amplified solid-state imaging devices guide signal charges, which are generated and accumulated by photoelectric conversion units of pixels that light enters, to amplifying units provided in the pixels, and output signals, which are amplified by the amplifying units, from the pixels. In the amplified type solid-state imaging devices, a plurality of such pixels are arranged in a two-dimensional matrix. In the amplified solid-state imaging devices, for example, there is a CMOS type solid-state imaging device using CMOS (Complementary Metal Oxide Semiconductor) transistors.

For example, Japanese Unexamined Patent Application, First Publication No. 2010-160314 suggests a CMOS type solid-state imaging device that includes a plurality of pairs of photoelectric conversion units (photodiodes) that not only obtain imaging signals but also receive a light beam that enters an imaging optical system from a subject, passing through a pair of partial regions (for example, left and right pupil portions) in an exit pupil of an imaging optical system, and generate pixel signals corresponding to the respective partial regions, and that utilizes imaging elements capable of focus detection of a phase difference detection method.

SUMMARY OF THE INVENTION

A solid-state imaging device related to a first aspect of the invention is a solid-state imaging device including a first substrate having a plurality of first photoelectric conversion units; a second substrate having a plurality of second photoelectric conversion units and a first connection electrically connected to the first substrate; and a third substrate having a circuit that processes a signal and a second connection electrically connected to the second substrate. At least one of the first substrate and the second substrate has a selector that selects the angle of a light ray that is transmitted through the first substrate and enters the second substrate.

According to a second aspect of the invention, in the above first aspect, the selector may be formed from a material that shields light, and the selector may be a layer that has an opening portion that transmits only a portion of the light that has entered the first substrate and has been transmitted through the first photoelectric conversion units.

According to a third aspect of the invention, in the above second aspect, the layer may constitute a wiring line within the first substrate.

A solid-state imaging device of a fourth aspect of the invention is a solid-state imaging device including a first substrate having a plurality of first photoelectric conversion units; and a second substrate having a connection electrically connected to the first substrate, a plurality of second photoelectric conversion units, and a circuit that processes a signal. At least one of the first substrate and the second substrate has a selector that selects the angle of the light ray that is transmitted through the first substrate and enters the second substrate.

According to a fifth aspect of the invention, in the above fourth aspect, the selector may be formed from a material that shields light, and the selector may be a layer that has an opening portion that transmits only a portion of the light that has entered the first substrate and has been transmitted through the first photoelectric conversion units.

According to a sixth aspect of the invention, in the above fifth aspect, the layer constitutes a wiring line within the first substrate or the second substrate.

According to a seventh aspect of the invention, in the above first aspect, the number of the plurality of first photoelectric conversion units and the number of the plurality of second photoelectric conversion units may be the same, and a light transmitted through only one first photoelectric conversion unit among the plurality of first photoelectric conversion units may enter one second photoelectric conversion unit among the plurality of second photoelectric conversion units.

According to an eighth aspect of the invention, in the above fourth aspect, the number of the plurality of first photoelectric conversion units and the number of the plurality of second photoelectric conversion units may be the same, and the light transmitted through only one first photoelectric conversion unit among the plurality of first photoelectric conversion units may enter one second photoelectric conversion unit among the plurality of second photoelectric conversion units.

According to a ninth aspect of the invention, in the above first aspect, the number of the plurality of second photoelectric conversion units may be smaller than the number of the plurality of first photoelectric conversion units, and the light transmitted through the plurality of first photoelectric conversion units may enter one second photoelectric conversion unit among the plurality of second photoelectric conversion units.

According to a tenth aspect of the invention, in the above fourth aspect, the number of the plurality of second photoelectric conversion units may be smaller than the number of the plurality of first photoelectric conversion units, and the light transmitted through the plurality of first photoelectric conversion units may enter one second photoelectric conversion unit among the plurality of second photoelectric conversion units.

A camera system related to an eleventh aspect of the invention may include the above solid-state imaging device.

DETAILED DESCRIPTION OF THE INVENTION

Figure 1:
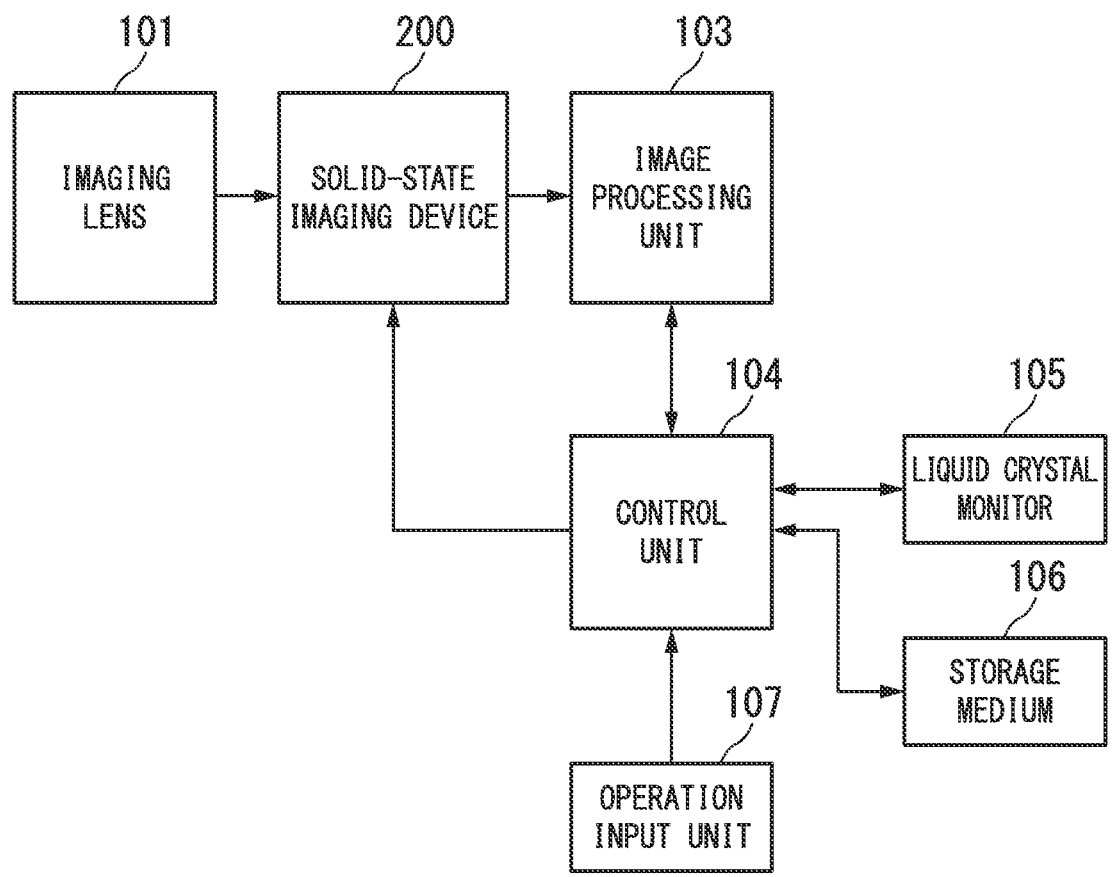
FIG. 1 is a block diagram showing the configuration of a camera system according to a first embodiment of the invention.

Embodiments of the invention will be described below referring to the drawings.

First Embodiment

First, a first embodiment of the invention will be described. FIG. 1 shows the configuration of a camera system according to the present embodiment. The camera system of the present embodiment may be, besides digital cameras, digital camcorders, endoscopes, camera modules for cellular phones, or the like, if the electronic equipment has an imaging function. The camera system shown in FIG. 1 has an imaging lens 101, a solid-state imaging device 200, an image processing unit 103, a control unit 104, a liquid crystal monitor 105, a storage medium 106, and an operation input unit 107.

The imaging lens 101 forms a subject image to be formed by the light from a subject, on a two-dimensional pixel array arranged in the solid-state imaging device 200. The solid-state imaging device 200 outputs signals (imaging signals for image formation and signals for focus detection) based on the subject image formed on the two-dimensional pixel array in which a number of pixels are arrayed. The image processing unit 103 has the function of performing signal processing, such as chrominance signal processing, gain processing, and white balance processing, on the imaging signals output from the solid-state imaging device 200, and converts the processed signals into signals in a format that can be displayed on the liquid crystal monitor 105 or stored in the storage medium 106. Additionally, the image processing unit 103 performs focus detection using a phase difference detection method, on the basis of the signals for focus detection output from the solid-state imaging device 200.

The control unit 104 is electrically connected to the respective units within the camera system, and controls the camera system. The operation of the control unit 104 is specified in a program stored in a built-in ROM of the camera system. The control unit 104 reads this program and performs various kinds of control, such as auto-focusing, according to the contents specified by the program. The liquid crystal monitor 105 displays an image on the basis of the imaging signals processed by the image processing unit 103. The storage medium 106 stores image data based on the imaging signals processed by the image processing unit 103. The operation input unit 107 has buttons, switches, or the like to be operated by a user. An operation result of a user is input to the control unit 104 as a signal via the operation input unit 107. For example, setting of a shooting mode, shutter release of a still image, and instructions for the start and end of moving image shooting are performed via the operation input unit 107.

In the camera system of the present embodiment, the imaging signals for image formation and the signals for focus detection can be obtained by the solid-state imaging device 200, and it is not necessary to provide separate sensors in order to obtain the signals for focus detection. Therefore, the configuration of the equipment can be simplified.

Figure 2:
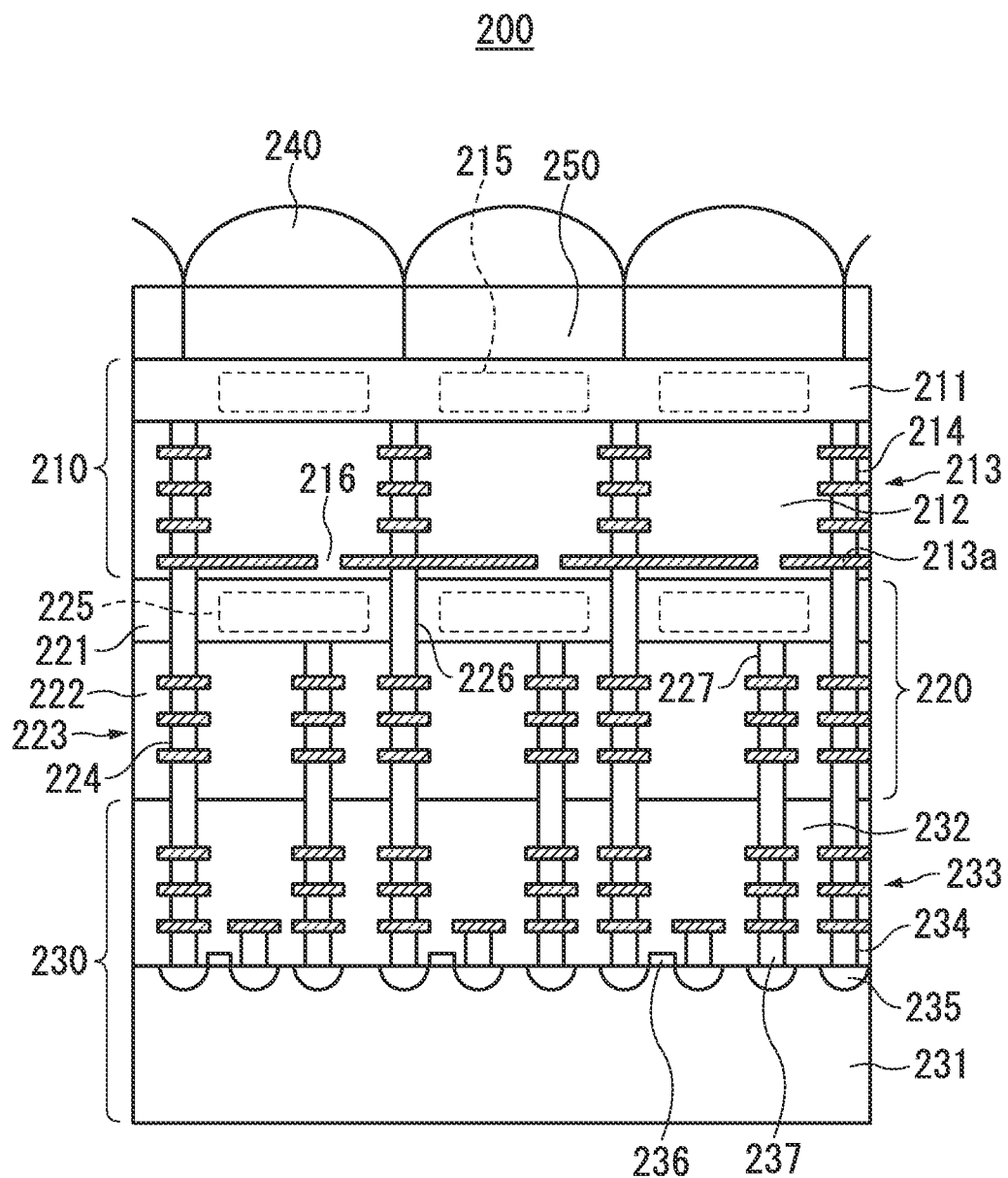
FIG. 2 is a partial cross-sectional view of a solid-state imaging device of the camera system according to the first embodiment of the invention.

FIG. 2 shows the configuration of the solid-state imaging device 200 in cross-sectional view. The solid-state imaging device 200 is configured to have a first substrate 210 in which a plurality of photoelectric conversion units 215 (first photoelectric conversion units) are formed, a second substrate 220 in which a plurality of photoelectric conversion units 225 (second photoelectric conversion units) are formed, and a third substrate 230 in which a plurality of MOS transistors are formed. The first substrate 210, the second substrate 220, and the third substrate 230 have a laminated structure, and are overlapped and bonded together so that mutual principal surfaces face each other.

Light enters from the upper side in the drawing, and micro lenses 240 that focus the light from a subject and color filters 250 corresponding to predetermined colors are formed on the surface of the first substrate 210.

As shown in FIG. 2, the first substrate 210 is constituted by a semiconductor substrate 211 in which the photoelectric conversion units 215 are formed, and a multilayer wiring layer in which an insulating film 212, wiring lines 213 (selectors), and vias 214 are formed. The photoelectric conversion units 215 are, for example, embedded photodiodes constituted by an N-type well that is formed in a P-type well layer and a P+-type impurity region that have contact with the N-type well and is formed on the surface side of the P-type well layer.

The wiring lines 213 are laminated via the insulating film 212, and form the multilayer wiring layer by connecting respective wiring layers by means of the vias 214. In FIG. 2, the wiring lines 213 have four wiring layers. One wiring layer 213a among the wiring lines 213 has opening portions 216 for allowing only a portion of the light that has entered the first substrate 210 and has been transmitted through the photoelectric conversion units 215 to be selectively transmitted therethrough, and the remaining wiring layers are arranged so as not to shield the light that enters the opening portions 216. The wiring line 213a is used for transmission of signals within the first substrate 210 or supply of a power-source voltage or a ground voltage, and is also used as a shielding layer for light. For this reason, the wiring line 213a is made of materials (for example, metals, such as aluminum and copper) that have conductivity and have light shielding characteristics. In the present embodiment, the wiring layer 213a is arranged on the second substrate 220 side of the first substrate 210.

Figure 3:
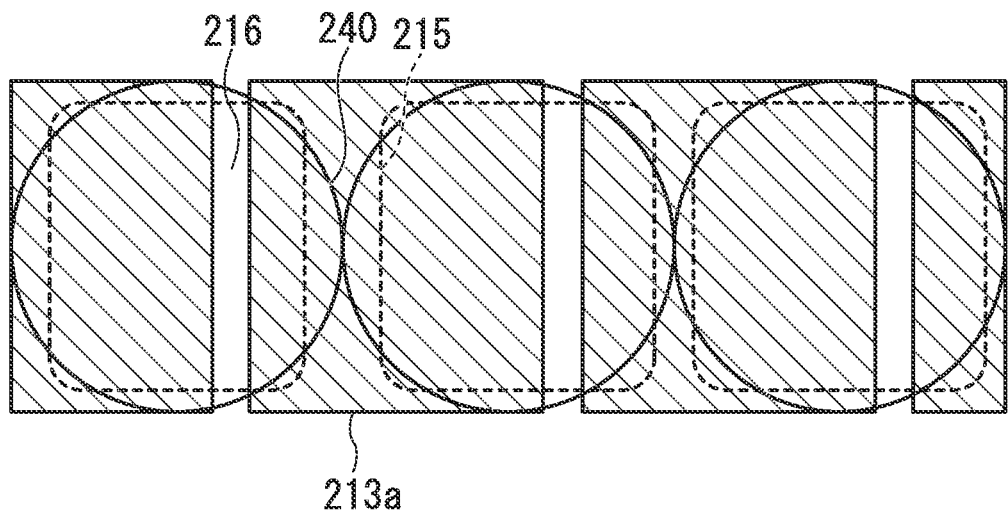
FIG. 3 is a partial plan view of the solid-state imaging device of the camera system according to the first embodiment of the invention.

FIG. 3 shows a state where only a portion equivalent to three pixels of the solid-state imaging device 200 shown in FIG. 2 is seen in plan view.

The planar positional relationship of the wiring line 213, the opening portions 216, the photoelectric conversion units 215, and the micro lenses 240 is as shown in FIG. 3. The photoelectric conversion units 215 are formed in a square shape, and the micro lenses 240 are formed in a circular shape so as to cover the photoelectric conversion units 215. The opening portions 216 are formed in a slit shape that is vertically elongated.

As shown in FIG. 2, the second substrate 220 is constituted by a semiconductor substrate 221 in which the photoelectric conversion units 225 and through vias 226 (first connection) are formed, and a multilayer wiring layer in which an insulating film 222, wiring lines 223 and vias 224 and 227 are formed. The photoelectric conversion units 225 are, for example, photodiodes similarly to the photoelectric conversion units 215. Additionally, the photoelectric conversion units 225 are arranged to face the photoelectric conversion units 215 and the opening portions 216 so that the light that has entered the solid-state imaging device 200 enters the photoelectric conversion units 225. The through vias 226 are electrically connected to the vias 214 of the first substrate 210 at an interface between the first substrate 210 and the second substrate 220, and are electrically connected to the vias 224 of the second substrate 220 at an interface between the semiconductor substrate 221 and the insulating film 222. The through vias 226 are insulated from the semiconductor substrate 221. The vias 227 are connected to the semiconductor substrate 221.

The wiring lines 223 are laminated via the insulating film 222, and form the multilayer wiring layer by connecting respective wiring layers by means of the vias 224 and 227. In FIG. 2, the wiring lines 223 have three wiring layers. Since the wiring lines 223 are used for transmission of signals within the second substrate 220 or supply of a power-source voltage or a ground voltage, the wiring lines are made of materials (for example, metals, such as aluminum and copper) that have conductivity.

As shown in FIG. 2, the third substrate 230 is constituted by a semiconductor substrate 231 that has a plurality of MOS transistors including an impurity region 235 and a gate 236, and a multilayer wiring layer in which an insulating film 232, wiring lines 233, and vias 234 and 237 (second connection) are formed. The wiring lines 233 are laminated via the insulating film 232, and form the multilayer wiring layer by connecting respective wiring layers by means of the vias 234 and 237. In FIG. 2, the wiring lines 233 have three wiring layers.

Since the wiring lines 233 are used for transmission of signals within the third substrate 230 or supply of a power-source voltage or a ground voltage, the wiring lines are made of materials (for example, metals, such as aluminum and copper) that have conductivity. The vias 234 and the vias 224 are electrically connected at an interface between the second substrate 220 and the third substrate 230. Additionally, the vias 237 and the vias 227 are electrically connected at the interface between the second substrate 220 and the third substrate 230.

The light that has entered the solid-state imaging device 200 is condensed by the micro lenses 240 and enters the photoelectric conversion units 215. This light is photoelectrically converted by the photoelectric conversion units 215, and signals according to the quantity of light are generated. The signals generated by the photoelectric conversion units 215 are transmitted to the third substrate 230 via the vias 214 and multilayer wiring layer (213) of the first substrate 210, and the through vias 226, vias 224, and multilayer wiring layer (223) of the second substrate 220. The signals transmitted to the third substrate 230 are transmitted via the vias 234 and multilayer wiring layer (233) of the third substrate 230, are processed by circuits, such as the MOS transistors of the third substrate 230, and are output as imaging signals.

Additionally, the light transmitted through the semiconductor substrate 211 of the first substrate 210 in the light that has entered the solid-state imaging device 200 passes through the opening portions 216, and enters the photoelectric conversion units 225 of the second substrate 220. This light is photoelectrically converted by the photoelectric conversion units 225, and signals according to the quantity of light are generated. Selecting entering light two-dimensionally by means of the opening portions 216 is equal to selecting the light ray angle of the light that enters the solid-state imaging device 200. Hence, the signals obtained by the photoelectric conversion units 225 correspond to the light ray angle of the light that has entered the solid-state imaging device 200. The signals generated by the photoelectric conversion units 225 are transmitted to the third substrate 230 via the vias 227 and multilayer wiring layer (223) of the second substrate 220. The signals transmitted to the third substrate 230 are transmitted via the vias 237 and multilayer wiring layer of the third substrate 230, and are processed by circuits, such as the MOS transistors of the third substrate 230, and are output as signals for focus detection.

Figure 4:
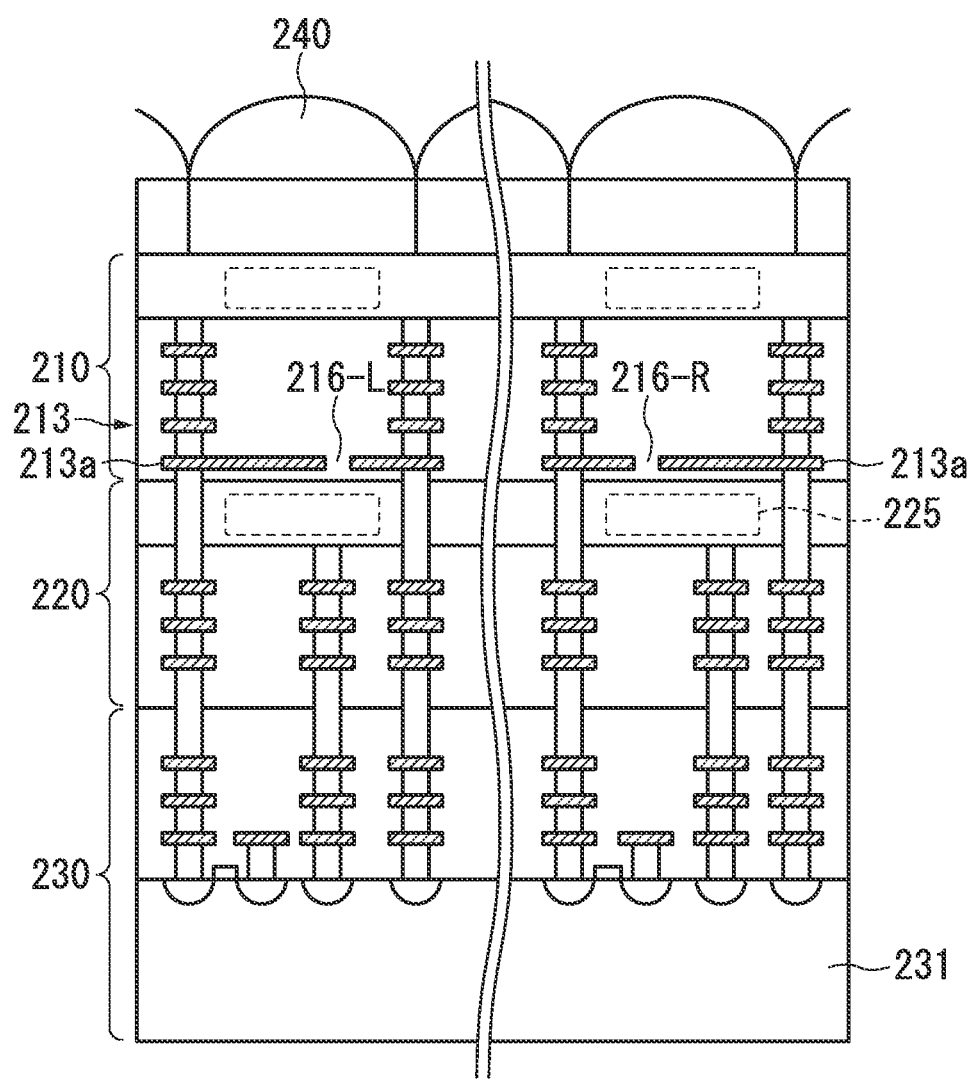
FIG. 4 is a partial cross-sectional view of the solid-state imaging device of the camera system according to the first embodiment of the invention.
Figure 5:
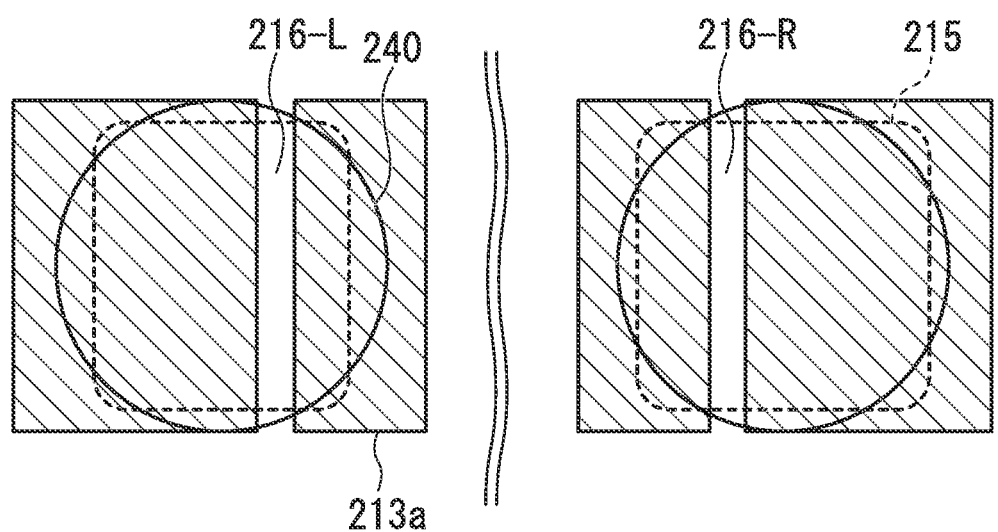
FIG. 5 is a partial plan view of the solid-state imaging device of the camera system according to the first embodiment of the invention.

FIG. 4 shows the configuration of only a portion equivalent to two pixels including the photoelectric conversion units 225 that become a pair for focus detection of the phase difference detection method in the solid-state imaging device 200 shown in FIG. 2, in cross-sectional view. FIG. 5 shows a state where only a portion equivalent to two pixels including the photoelectric conversion units 225 that become the pair for focus detection of the phase difference detection method in the solid-state imaging device 200 shown in FIG. 2, is seen in plan view. An opening portion 216-L is formed in the wiring line 213a of a left pixel, and an opening portion 216-R is formed in the wiring line 213a of a right pixel. The opening portion 216-R and the opening portion 216-L are arranged so that the planar positions thereof within the respective pixels become bilaterally symmetrical. A plurality of pixels that become pairs arranged at positions where the opening portions 216 are bilaterally symmetrical or vertically symmetrical as in the opening portion 216-R and the opening portion 216-L are arranged within an imaging surface of the solid-state imaging device 200. The signals generated by the photoelectric conversion units 225 of these pixels that become pairs can be used for focus detection.

In the above solid-state imaging device 200, when the solid-state imaging device 200 is seen in plan view, the photoelectric conversion units 225 of the same number as the photoelectric conversion units 215 of the first substrate 210 are arranged in the second substrate 220 so as to be located at the same positions as the photoelectric conversion units 215 of the first substrate 210, and both are correlated on a one-to-one basis. In a case where one photoelectric conversion unit 215 is arranged in each of the effective pixels of the imaging surface, it is possible to arrange the photoelectric conversion units 225 of the same number as the effective pixels of the imaging surface. For this reason, the focus detection can be performed even in a case where the light from a subject is focused on any location of the effective pixel region of the imaging surface.

Figure 6:
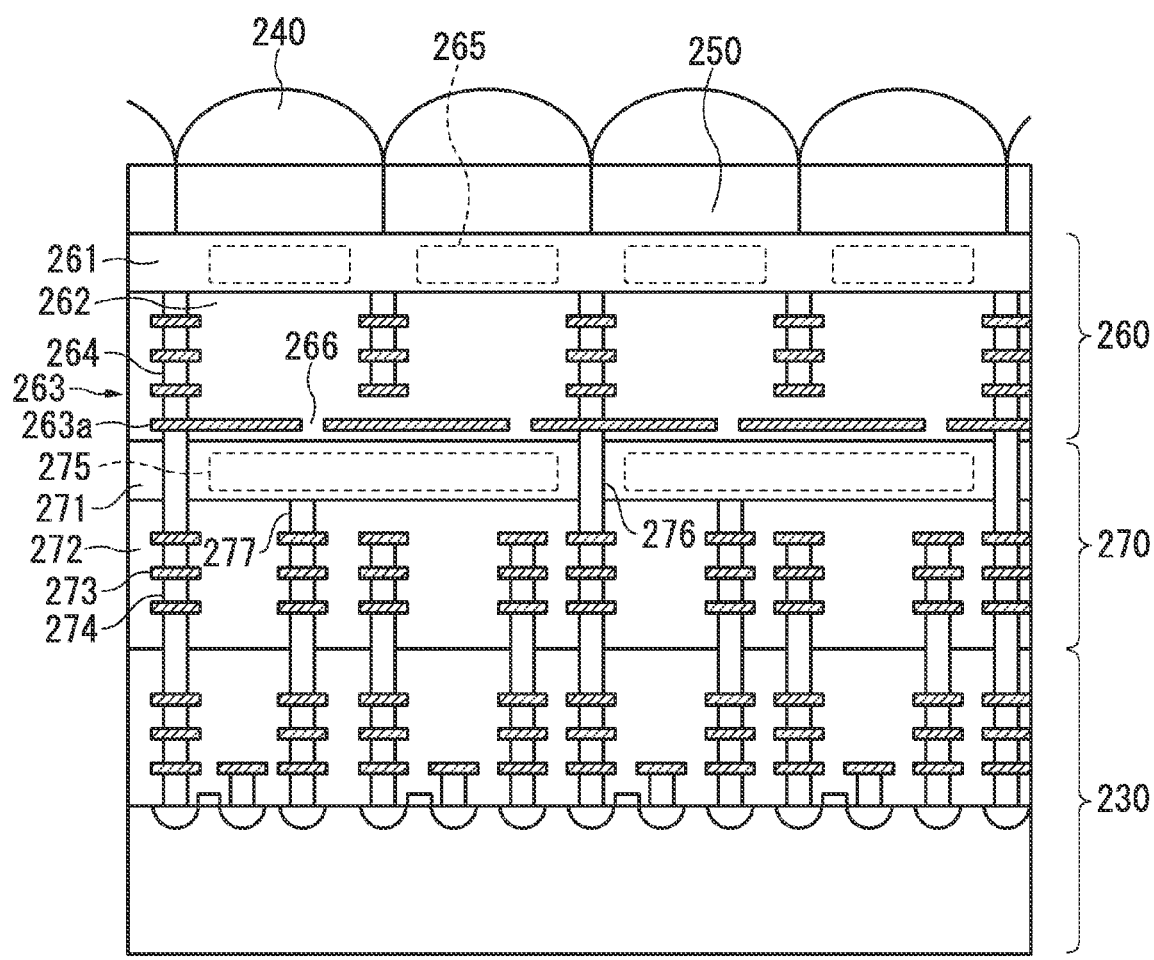
FIG. 6 is a partial cross-sectional view of the solid-state imaging device of the camera system according to the first embodiment of the invention.

Next, a modification example of the present embodiment will be described. FIG. 6 shows the configuration of a solid-state imaging device 201 related to the present modification example in cross-sectional view. The configuration of the solid-state imaging device 201 shown in FIG. 6 is a configuration in which the first substrate 210 of the above solid-state imaging device 200 is substituted with a first substrate 260 and the second substrate 220 is substituted with a second substrate 270.

As shown in FIG. 6, the first substrate 260 is constituted by a semiconductor substrate 261 in which photoelectric conversion units 265 are formed, and a multilayer wiring layer in which an insulating film 262, wiring lines 263, and vias 264 are formed. One wiring layer 263a among the wiring lines 263 has opening portions 266 for allowing only a portion of the light that has entered the first substrate 260 and has been transmitted through the photoelectric conversion units 265 to be selectively transmitted therethrough, and the remaining wiring layers are arranged so as not to shield the light that enters the opening portions 266. One opening portion 266 is formed in each pixel.

In the present embodiment, the wiring layer 263a is arranged on the second substrate 270 side of the first substrate 260.

As shown in FIG. 6, the second substrate 270 is constituted by a semiconductor substrate 271 in which photoelectric conversion units 275 and through vias 276 are formed, and a multilayer wiring layer formed by an insulating film 272, wiring lines 273, and vias 274 and 277. In the above solid-state imaging device 200, the photoelectric conversion units 265 are formed on a one-to-one basis with respect to the photoelectric conversion units 215, whereas in the solid-state imaging device 201 of the present modification example, one photoelectric conversion unit 275 is formed with respect to two photoelectric conversion units 265.

In other words, in the above solid-state imaging device 200, the number of the photoelectric conversion units 215 and the number of the photoelectric conversion units 225 are the same, and the light transmitted through only one photoelectric conversion unit 215 enters one photoelectric conversion unit 225.

In contrast, in the solid-state imaging device 201 of the present modification example, the number of the photoelectric conversion units 265 is twice the number of the photoelectric conversion units 275, and the light transmitted through two photoelectric conversion units 265 enters one photoelectric conversion units 275.

For this reason, the region of the photoelectric conversion units 275 in the solid-state imaging device 201 of the present modification example is larger than the region of the photoelectric conversion units 225 in the above solid-state imaging device 200. By enlarging the region of the photoelectric conversion units in this way, the S/N ratio of signals to be obtained can be improved. Although a configuration in which the number of the photoelectric conversion units 265 and the number of the photoelectric conversion units 275 become 2:1 is adopted in the present embodiment, the light from substantially the same portion of a subject may be transmitted through a plurality of photoelectric conversion units 265 and enter the same photoelectric conversion unit 275, and the ratio of the number of the photoelectric conversion units 265 and the number of the photoelectric conversion units 275 may be changed to ratios other than the above ratio.

In the present embodiment, the first substrate 210 or 260 is formed with the wiring lines 213 or 263 in which the opening portions 216 or 266 for selecting the light ray angle of the light that enters the photoelectric conversion units 225 or 275 of the second substrate 220 or 270 are formed. Instead of this, however, a layer that has the same function may be formed in the second substrate 220 or 270.

As described above, according to the present embodiment, the photoelectric conversion units are arranged in both the first substrate 210 or 260 and the second substrate 220 or 270. Thus, as compared to a case where photoelectric conversion units for obtaining imaging signals and photoelectric conversion units for obtaining signals for focus detection are arranged in the same plane, signals to be used for the focus detection of the phase difference detection method can be generated while reducing a decline in the resolution of the imaging signals. Additionally, by using the wiring lines 213 or 263 as a layer that selects the light ray angle, the opening portions 216 or 266 can be easily formed by a semiconductor process. Moreover, the light ray angle can be easily selected by forming the opening portions 216 or 266 in the wiring lines 213 or 263.

Additionally, by arranging the photoelectric conversion units 225 of the same number as the photoelectric conversion units 215 of the first substrate 210 in the second substrate 220 and correlating both on a one-to-one basis, the focus detection can be performed even in a case where the light from a subject is focused on any location of the effective pixel region of the imaging surface. Additionally, by making the number of the photoelectric conversion units 265 of the first substrate 260 more than the number of the photoelectric conversion units 275 of the second substrate 270, the S/N ratio of signals to be used for the focus detection of the phase difference detection method can be improved.

Second Embodiment

Next, a second embodiment of the invention will be described. The configuration of a camera system according to the present embodiment is a configuration in which the solid-state imaging device 200 in FIG. 1 is substituted with a solid-state imaging device 300 shown in FIG. 7.

Figure 7:
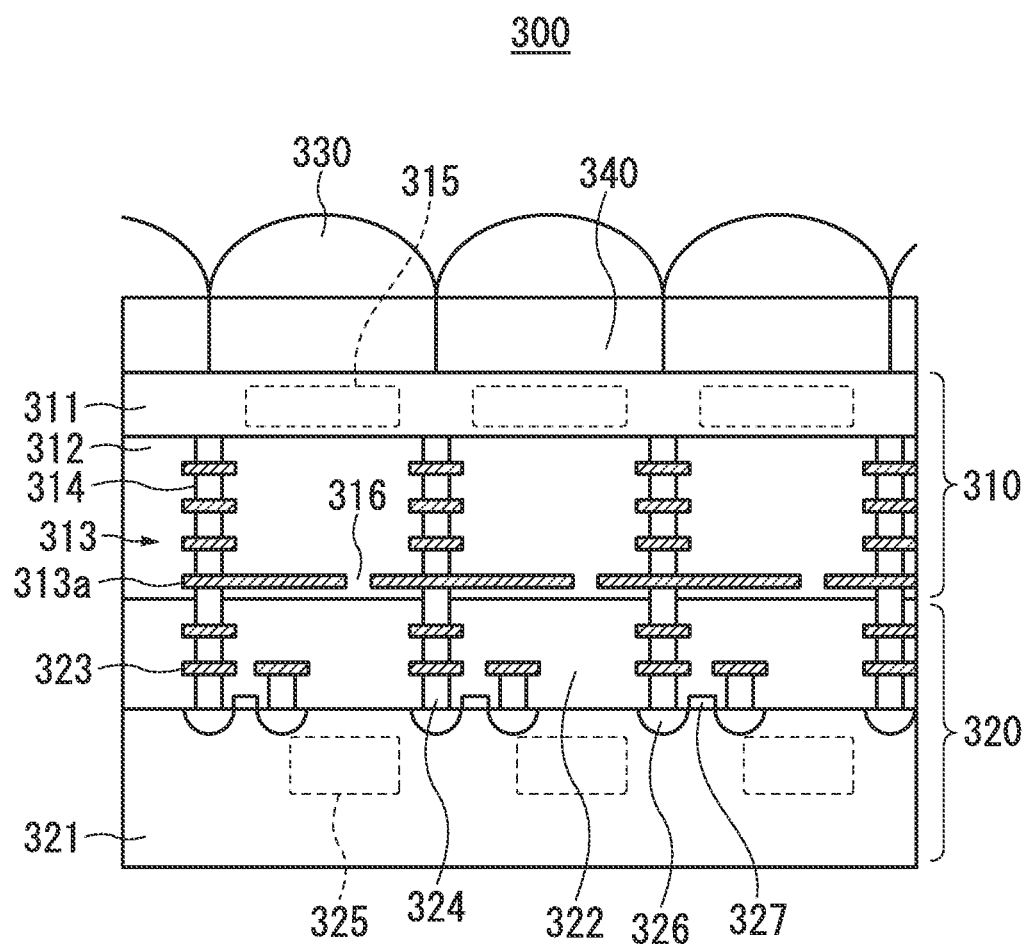
FIG. 7 is a partial cross-sectional view of a solid-state imaging device of a camera system according to a second embodiment of the invention.

FIG. 7 shows the configuration of the solid-state imaging device 300 in cross-sectional view. The solid-state imaging device 300 is configured to have a first substrate 310 in which a plurality of photoelectric conversion units 315 (first photoelectric conversion units) are formed, and a second substrate 320 in which a plurality of photoelectric conversion units 325 (second photoelectric conversion units) and a plurality of MOS transistors are formed. The first substrate 310 and the second substrate 320 have a laminated structure, and are overlapped and bonded together so that mutual principal surfaces face each other. Light enters from the upper side in the drawing, and micro lenses 330 that focus the light from a subject and color filters 340 corresponding to predetermined colors are formed on the surface of the first substrate 310.

As shown in FIG. 7, the first substrate 310 is constituted by a semiconductor substrate 311 in which the photoelectric conversion units 315 are formed, and a multilayer wiring layer in which an insulating film 312, wiring lines 313 (selectors), and vias 314 are formed. The photoelectric conversion units 315 are, for example, embedded photodiodes constituted by an N-type well that is formed in a P-type well layer and a P+-type impurity region that have contact with the N-type well and is formed on the surface side of the P-type well layer.

The wiring lines 313 are laminated via the insulating film 312, and form the multilayer wiring layer by connecting respective wiring layers by means of the vias 314. In FIG. 7, the wiring lines 313 have four wiring layers. One wiring layer 313a among the wiring lines 313 has opening portions 316 for allowing only a portion of the light that has entered the first substrate 310 and has been transmitted through the photoelectric conversion units 315 to be selectively transmitted therethrough, and the remaining wiring layers are arranged so as not to shield the light that enters the opening portions 316. The wiring line 313a is used for transmission of signals within the first substrate 310 or supply of a power-source voltage or a ground voltage, and is also used as a shielding layer for light. For this reason, the wiring line 313a is made of materials (for example, metals, such as aluminum and copper) that have conductivity and have light shielding characteristics.

As shown in FIG. 7, the second substrate 320 is constituted by the photoelectric conversion units 325, a semiconductor substrate 321 that has a plurality of MOS transistors including an impurity region 326 and a gate 327, and a multilayer wiring layer in which an insulating film 322, wiring lines 323, and vias 324 (connections) are formed. The photoelectric conversion units 325 are, for example, photodiodes similarly to the photoelectric conversion units 315. Additionally, the photoelectric conversion units 325 are arranged at positions that face the photoelectric conversion units 315 so that the light that has entered the solid-state imaging device 300 enters the photoelectric conversion units 325. The wiring lines 323 are laminated via the insulating film 322, and form the multilayer wiring layer by connecting respective wiring layers by means of the vias 324. In FIG. 7, the wiring lines 323 have two wiring layers, and are arranged so as not to shield the light that has passed through the opening portions 316.

In the present embodiment, the wiring layer 313a is arranged on the second substrate 320 side of the first substrate 310.

Since the wiring lines 323 are used for transmission of signals within the second substrate 320 or supply of a power-source voltage or a ground voltage, the wiring lines are made of materials (for example, metals, such as aluminum and copper) that have conductivity. The vias 324 and the vias 314 are electrically connected at an interface between the first substrate 310 and the second substrate 320.

The light that has entered the solid-state imaging device 300 is condensed by the micro lenses 330 and enters the photoelectric conversion units 315. This light is photoelectrically converted by the photoelectric conversion units 315, and signals according to the quantity of light are generated. The signals generated by the photoelectric conversion units 315 are transmitted to the second substrate 320 via the vias 314 and multilayer wiring layer (313) of the first substrate 310. The signals transmitted to the second substrate 320 are transmitted via the vias 324 and multilayer wiring layer (323) of the second substrate 320, are processed by circuits, such as the MOS transistors of the second substrate 320, and are output as imaging signals.

Additionally, the light transmitted through the semiconductor substrate 311 of the first substrate 310 in the light that has entered the solid-state imaging device 300 passes through the opening portions 316, and enters the photoelectric conversion units 325 of the second substrate 320. This light is photoelectrically converted by the photoelectric conversion units 325, and signals according to the quantity of light are generated. Selecting entering light two-dimensionally by means of the opening portions 316 is equal to selecting the light ray angle of the light that enters the solid-state imaging device 300. Hence, the signals obtained by the photoelectric conversion units 325 correspond to the light ray angle of the light that has entered the solid-state imaging device 300. The signals generated by the photoelectric conversion units 325 are transmitted via the multilayer wiring layer of the second substrate 320, are processed by circuits, such as the MOS transistors of the second substrate 320, and are output as signals for the focus detection.

In the present embodiment, the first substrate 310 is formed with the wiring lines 313 in which the opening portions 316 for selecting the light ray angle of the light that enters the photoelectric conversion units 325 of the second substrate 320 are formed. Instead of this, however, a layer that has the same function may be formed in the second substrate 320.

As described above, according to the present embodiment, the photoelectric conversion units are arranged in both the first substrate 310 and the second substrate 320. Thus, as compared to a case where photoelectric conversion units for obtaining imaging signals and photoelectric conversion units for obtaining signals for focus detection are arranged in the same plane, signals to be used for the focus detection of the phase difference detection method can be generated while reducing a decline in the resolution of the imaging signals. Additionally, by using the wiring lines 313 as a layer that selects the light ray angle, the opening portions 316 can be easily formed by a semiconductor process. Moreover, the light ray angle can be easily selected by forming the opening portions 316 in the wiring lines 313.

Additionally, by arranging the photoelectric conversion units 325 of the same number as the photoelectric conversion units 315 of the first substrate 310 in the second substrate 320 and correlating both on a one-to-one basis, the focus detection can be performed even in a case where the light from a subject is focused on any location of the effective pixel region of the imaging surface.

Third Embodiment

Next, a third embodiment of the invention will be described. The configuration of a camera system according to the present embodiment is a configuration in which the solid-state imaging device 200 in FIG. 1 is substituted with a solid-state imaging device 400 shown in FIG. 8.

Figure 8:
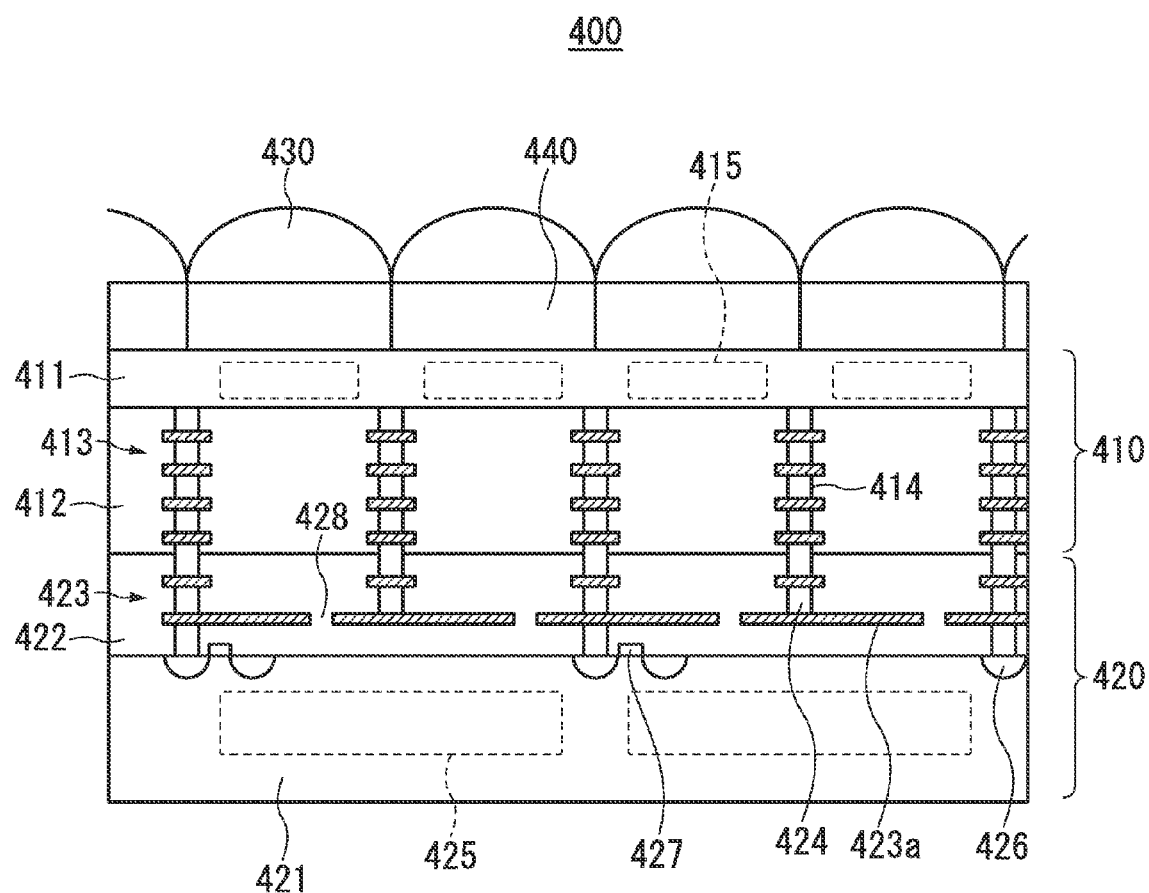
FIG. 8 is a partial cross-sectional view of a solid-state imaging device of a camera system according to a third embodiment of the invention.

FIG. 8 shows the configuration of the solid-state imaging device 400 in cross-sectional view. The solid-state imaging device 400 is configured to have a first substrate 410 in which a plurality of photoelectric conversion units 415 (first photoelectric conversion units) are formed, and a second substrate 420 in which a plurality of photoelectric conversion units 425 (second photoelectric conversion units) and a plurality of MOS transistors are formed. The first substrate 410 and the second substrate 420 have a laminated structure, and are overlapped and bonded together so that mutual principal surfaces face each other. Light enters from the upper side in the drawing, and micro lenses 430 that focus the light from a subject and color filters 440 corresponding to predetermined colors are formed on the surface of the first substrate 410.

As shown in FIG. 8, the first substrate 410 is constituted by a semiconductor substrate 411 in which the photoelectric conversion units 415 are formed, and a multilayer wiring layer in which an insulating film 412, wiring lines 413, and vias 414 are formed. The photoelectric conversion units 415 are, for example, embedded photodiodes constituted by an N-type well that is formed in a P-type well layer and a P+-type impurity region that have contact with the N-type well and is formed on the surface side of the P-type well layer.

The wiring lines 413 are laminated via the insulating film 412, and form the multilayer wiring layer by connecting respective wiring layers by means of the vias 414. In FIG. 8, the wiring lines 413 have four wiring layers. The wiring lines 413 are arranged so as not to shield the light that enters the first substrate 410, is transmitted through the photoelectric conversion units 415, and enters opening portions 428. The wiring lines 413 are used for transmission of signals within the first substrate 410 or supply of a power-source voltage or a ground voltage, and are also used as a shielding layer for light. For this reason, the wiring lines 413 are made of materials (for example, metals, such as aluminum and copper) that have conductivity and have light shielding characteristics.

As shown in FIG. 8, the second substrate 420 is constituted by the photoelectric conversion units 425, a semiconductor substrate 421 that has a plurality of MOS transistors including an impurity region 426 and a gate 427, and a multilayer wiring layer in which an insulating film 422, wiring lines 423 (selectors), and vias 424 (connections) are formed. The insulating film 422 is arranged on the first substrate 410 side. The photoelectric conversion units 425 are, for example, photodiodes similarly to the photoelectric conversion units 415. Additionally, the photoelectric conversion units 425 are arranged at positions that face the photoelectric conversion units 415 so that the light that has entered the solid-state imaging device 400 enters the photoelectric conversion units 425. The wiring lines 423 are laminated via the insulating film 422, and form the multilayer wiring layer by connecting respective wiring layers by means of the vias 424. In FIG. 8, the wiring lines 423 have two wiring layers.

One wiring layer 423a among the wiring lines 423 has opening portions 428 for allowing only a portion of the light that has entered the first substrate 410 and has been transmitted through the photoelectric conversion units 415 to be selectively transmitted therethrough, and the remaining wiring layers are arranged so as not to shield the light that enters the opening portions 428. Since the wiring lines 423 are used for transmission of signals within the second substrate 420 or supply of a power-source voltage or a ground voltage and are also used as a shielding layer for light, the wiring lines are made of materials (for example, metals, such as aluminum and copper) that have conductivity and light shielding characteristics. The vias 424 and the vias 414 are electrically connected at an interface between the first substrate 410 and the second substrate 420.

The light that has entered the solid-state imaging device 400 is condensed by the micro lenses 430 and enters the photoelectric conversion units 415. This light is photoelectrically converted by the photoelectric conversion units 415, and signals according to the quantity of light are generated. The signals generated by the photoelectric conversion units 415 are transmitted to the second substrate 420 via the vias 414 and multilayer wiring layer of the first substrate 410. The signals transmitted to the second substrate 420 are transmitted via the vias 424 and multilayer wiring layer of the second substrate 420, are processed by circuits, such as the MOS transistors of the second substrate 420, and are output as imaging signals.

Additionally, the light transmitted through the semiconductor substrate 411 of the first substrate 410 in the light that has entered the solid-state imaging device 400 enters the second substrate 420. The light that has entered the second substrate 420 passes through the opening portions 428, and enters the photoelectric conversion units 425. This light is photoelectrically converted by the photoelectric conversion units 425, and signals according to the quantity of light are generated. Selecting entering light two-dimensionally by means of the opening portions 428 is equal to selecting the light ray angle of the light that enters the solid-state imaging device 400. Hence, the signals obtained by the photoelectric conversion units 425 correspond to the light ray angle of the light that has entered the solid-state imaging device 400. The signals generated by the photoelectric conversion units 425 are transmitted via the multilayer wiring layer of the second substrate 420, are processed by circuits, such as the MOS transistors of the second substrate 420, and are output as signals for the focus detection.

In the solid-state imaging device 300 of the second embodiment, the photoelectric conversion units 315 are formed on a one-to-one basis with respect to the photoelectric conversion units 325, whereas in the solid-state imaging device 400 of the present embodiment, one photoelectric conversion unit 425 is formed with respect to two photoelectric conversion units 415. In other words, in the solid-state imaging device 300 of the second embodiment, the number of the photoelectric conversion units 315 and the number of the photoelectric conversion units 325 are the same, and the light transmitted through only one photoelectric conversion unit 315 enters one photoelectric conversion unit 325. In contrast, in the solid-state imaging device 400 of the present embodiment, the number of the photoelectric conversion units 415 is twice the number of the photoelectric conversion units 425, and the light transmitted through two photoelectric conversion units 415 enters one photoelectric conversion units 425.

For this reason, the region of the photoelectric conversion units 425 in the solid-state imaging device 400 of the present embodiment is larger than the region of the photoelectric conversion units 325 in the solid-state imaging device 300 of the second embodiment. By enlarging the region of the photoelectric conversion units 425 in this way, the S/N ratio of signals to be obtained can be improved. Although a configuration in which the number of the photoelectric conversion units 415 and the number of the photoelectric conversion units 425 become 2:1 is adopted in the present embodiment, the light from substantially the same portion of a subject may be transmitted through a plurality of photoelectric conversion units 415 and enter the same photoelectric conversion unit 425, and the ratio of the number of the photoelectric conversion units 415 and the number of the photoelectric conversion units 425 may be changed to ratios other than the above ratio.

In the present embodiment, the second substrate 420 is formed with the wiring lines 423 in which the opening portions 428 for selecting the light ray angle of the light that enters the photoelectric conversion units 425 of the second substrate 420 are formed. Instead of this, however, a layer that has the same function may be formed in the first substrate 410.

As described above, according to the present embodiment, the photoelectric conversion units are arranged in both the first substrate 410 and the second substrate 420. Thus, as compared to a case where photoelectric conversion units for obtaining imaging signals and photoelectric conversion units for obtaining signals for focus detection are arranged in the same plane, signals to be used for the focus detection of the phase difference detection method can be generated while reducing a decline in the resolution of the imaging signals. Additionally, by using the wiring lines 423 as a layer that selects the light ray angle, the opening portions 428 can be easily formed by a semiconductor process. Moreover, the light ray angle can be easily selected by forming the opening portions 428 in the wiring lines 423.

Additionally, by making the number of the photoelectric conversion units 415 of the first substrate 410 more than the number of the photoelectric conversion units 425 of the second substrate 420, the S/N ratio of signals to be used for the focus detection of the phase difference detection method can be improved.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

For example, in the above-embodiments, while the first substrate has the wiring layer (selector), at least one of the first substrate and the second substrate may have the wiring layer.

What is claimed is:
1. A solid-state imaging device comprising:
a first substrate which has a plurality of first photoelectric conversion units;
a second substrate which has a plurality of second photoelectric conversion units and a first connection electrically connected to the first substrate; and
a third substrate which has a circuit that processes a signal and a second connection electrically connected to the second substrate,
wherein at least one of the first substrate and the second substrate has a selector that selects the angle of a light ray that is transmitted through the first substrate and enters the second substrate.
2. The solid-state imaging device according to claim 1, wherein the selector is formed from a material that shields light, and wherein the selector is a layer that has an opening portion that transmits only a portion of the light that has entered the first substrate and has been transmitted through the first photoelectric conversion units.

3. The solid-state imaging device according to claim 2, wherein the layer constitutes a wiring line within the first substrate.

4. A solid-state imaging device comprising:
a first substrate having a plurality of first photoelectric conversion units; and
a second substrate having a connection electrically connected to the first substrate, a plurality of second photoelectric conversion units, and a circuit that processes a signal,
wherein at least one of the first substrate and the second substrate has a selector that selects the angle of a light ray that is transmitted through the first substrate and enters the second substrate.

5. The solid-state imaging device according to claim 4, wherein the selector is formed from a material that shields light, and
wherein the selector is a layer that has an opening portion that transmits only a portion of a light ray that has entered the first substrate and has been transmitted through the first photoelectric conversion units.

6. The solid-state imaging device according to claim 5, wherein the layer constitutes a wiring line within the first substrate or the second substrate.

7. The solid-state imaging device according to claim 1, wherein the number of the plurality of first photoelectric conversion units and the number of the plurality of second photoelectric conversion units are the same, and
wherein a light transmitted through only one first photoelectric conversion unit among the plurality of first photoelectric conversion units enters one second photoelectric conversion unit among the plurality of second photoelectric conversion units.

8. The solid-state imaging device according to claim 4, wherein the number of the plurality of first photoelectric conversion units and the number of the plurality of second photoelectric conversion units are the same, and
wherein the light transmitted through only one first photoelectric conversion unit among the plurality of first photoelectric conversion units enters one second photoelectric conversion unit among the plurality of second photoelectric conversion units.

9. The solid-state imaging device according to claim 1, wherein the number of the plurality of second photoelectric conversion units is smaller than the number of the plurality of first photoelectric conversion units, and
wherein the light transmitted through the plurality of first photoelectric conversion units enters one second photoelectric conversion unit among the plurality of second photoelectric conversion units.

10. The solid-state imaging device according to claim 4, wherein the number of the plurality of second photoelectric conversion units is smaller than the number of the plurality of first photoelectric conversion units, and
wherein the light transmitted through the plurality of first photoelectric conversion units enters one second photoelectric conversion unit among the plurality of second photoelectric conversion units.

11. A camera system comprising the solid-state imaging device according to claim 1.

12. A camera system comprising the solid-state imaging device according to claim 4.

* * * * *